United States Patent [19]
Buchanan et al.

[11] 3,849,775
[45] Nov. 19, 1974

[54] AC ANALOG TO DIGITAL CONVERTER

[75] Inventors: James E. Buchanan, Bowie; Joel E. Brown, Baltimore, both of Md.

[73] Assignee: Westinghouse Electric Corporation, Pittsburgh, Pa.

[22] Filed: Oct. 24, 1972

[21] Appl. No.: 300,027

[52] U.S. Cl. .................. 340/347 N T, 340/347 S Y
[51] Int. Cl. .......................................... H03k 13/20
[58] Field of Search ............ 340/347 N T, 347 S Y; 324/99 D; 235/183

[56] References Cited

UNITED STATES PATENTS

| | | | |
|---|---|---|---|
| 3,316,547 | 4/1967 | Ammann | 340/347 N T |
| 3,500,384 | 3/1970 | Naydan et al. | 340/347 N T |
| 3,509,559 | 4/1970 | Leconte | 340/347 N T |
| 3,510,867 | 5/1970 | Sliwa | 340/347 S Y |
| 3,566,265 | 2/1971 | Reid | 340/347 N T X |
| 3,566,397 | 2/1971 | Walton | 340/347 N T |
| 3,624,643 | 11/1971 | Richman | 340/347 N T |

OTHER PUBLICATIONS

Schmid, "Electronic Analog/Digital Conversions," 1970, pg. 426–434.

*Primary Examiner*—Charles D. Miller
*Attorney, Agent, or Firm*—J. B. Hinson

[57] ABSTRACT

An AC analog to digital converter provides a one step conversion of an alternating (AC) analog voltage to a digital number proportional to the amplitude of the input analog voltage. A zero crossing detector responsive to the analog input voltage actuates switching logic to supply one-half cycle of the input voltage to a conventional integrator. Control logic, at the initiation of the next successive half cycle following the half cycle of integration of the AC input, switches a reference voltage of appropriate polarity and predetermined amplitude to the integrator for discharging the integrator to a zero voltage output level. The control logic gates a clock pulse train to a counter during the time interval of discharge of the integrator and inhibits further gating of the clock pulses to the counter upon integration back to zero value. The count accumulated in the counter during the discharge interval is proportional to the input magnitude and affords a direct digital output representing the analog amplitude of the input. The reference voltages comprise absolute DC reference voltages or DC voltages which are compensated for variations in the AC signal source, the latter being provided by an integrate and hold circuit operated by the same switching and control logic outputs as utilized in the converter itself.

2 Claims, 11 Drawing Figures

AC ANALOG TO DIGITAL CONVERTER

BACKGROUND OF THE INVENTION

1. Field of the Invention

This invention relates to an AC analog to digital converter (AC–A/D converter) and, more particularly, to such a converter which provides for direct conversion of an alternating (AC) analog input voltage to an output digital number proportional to the amplitude of the AC analog input voltage.

2. State of the Prior Art

A typical AC–A/D converter requires that the input AC voltage be demodulated, filtered or integrated, and the resulting DC voltage obtained thereby be converted to a digital value, such as by a conventional DC–A/D converter. Such a circuit is illustrated in block diagram form in FIG. 1, the element 10 therein representing, variously, a filter, a demodulator, or an integrator. A suitable sampling switch, of course, may be provided for supply of samples of the AC inputs to the element 10, as in the case of an integrator, and a switch 12 typically is provided for selectively gating the DC voltage sample outputs of the element 10 to the converter 14. Suitable control logic is provided, as well.

Alternatively, the element 10 may comprise a filter which rectifies and filters the AC input voltage for producing the DC voltage. Such a technique, while acceptable for some applications, does not provide high accuracy and affords a relatively slow response time. More specifically, to achieve a reasonably accurate conversion, many cycles of the input voltage must be processed and averaged to achieve a reasonably accurate, corresponding DC voltage. This imposes a significant time delay; as a result, such a technique is not adaptable to a system subject to rapidly changing input AC voltages, and particularly where accuracies better than 0.1 percent required.

Accordingly, accurate AC–A/D converters required to have rapid time response typically employ an integrator for developing the DC voltage. Generally, one-half cycle of the AC input voltage is integrated and held for processing during the successive half cycle by the DC–A/D converter for producing the digital data output. This technique provides the highest speed of conversion while yielding accurate measurements.

In FIG. 2 is shown in block diagram form an illustration of such a prior art AC–D/A converter. The AC input voltage to be converted is supplied at input terminal 15. Zero crossing detector 16 provides outputs to the switch control logic 18, identifying each zero crossing of the AC input voltage. An integrator, comprising operational amplifier 20, input resistor 21 and capacitor 22, receives the input voltage through switch S1 for integration, and is cleared by switch S2, switches S1 and S2 being controlled by the logic 18.

The operation of the circuit in FIG. 2 is more readily understood from the timing charts of FIG. 3. Switch S1 is normally open, and switch S2 normally closed. The switching logic 18, when enabled by the start pulse, responds to the next zero crossing detector output shown at time T1, to close switch S1, and open switch S2. At the next zero crossing, shown at time T2, logic 18 opens switch S1, switch S2 remaining open during the succeeding half cycle. Switch S2 remains open until the next zero crossing, shown at time T3. The AC input signal is integrated during the half cycle of closure of switch S1, and thus from time T1 to time T2, the integrator producing at its output the voltage $e_o$ for the succeeding half cycle, and thus from time T2 to time T3. At time T3, switch S2 is closed and the stored DC value of the output $e_0$ rapidly discharges to zero.

The DC–A/D conversion is performed during the interval T2–T3 and accordingly a DC–A/D complete signal may be provided such as by a central processor (not shown) to clear the circuits and enable response to a succeeding half cycle of the AC input. Integration and conversion then continue, for successive, alternate half cycles. It is also known to employ a dual system essentially comprising two integrator circuits as in FIG. 2, operative in respectively alternate half cycles, thereby to increase the accuracy and speed of response of the conversion.

The DC output voltage derived from the integrator typically is supplied to a ladder network for conversion to a digital data output. The ladder network includes in association therewith a comparator responsive to reference voltages and a switch for each bit position of the digital data output (e.g., a converter providing a resolution of one part in 2,048 would employ 11 such bit switches). A particularly undesirable characteristic of such prior art converters is the high output impedance of the ladder network, which substantially complicates the design of the voltage comparator. The plurality of bit switches as well presents substantial complexity in the logic control of their actuation.

Whereas the prior art AC–D/A converter has been disclosed herein for purposes of illustration in a greatly simplified, block diagram form, it is appreciated by those skilled in the art that such systems are of substantial complexity and utilize many additional components than those generally set forth above. For example, many counter stages are required, both for producing the digital data outputs and as well for establishing timing, critical to proper functioning of the system. Accordingly, prior art AC–D/A converters affording rapid response and high accuracy (0.1 percent) are of substantial complexity and cost.

SUMMARY OF THE INVENTION

In accordance with the present invention, conversion of an AC input voltage to a digital data output is performed in what may be characterized as a one step technique, affording both high speed and high accuracy in the conversion of an alternating or oscillatory (AC) voltage to a binary digital number representing the magnitude of the input voltage. The converter, while affording comparable accuracy and speed, nevertheless is of substantially simplified design and reduced cost relative to prior art converters.

Basic components of the AC–A/D converter of the invention include an integrator, input and feedback control switches associated with the integrator, a comparator responsive to the integrator output, a zero crossing detector, switch control logic responsive to the detector for control of the switches associated with the integrator, a binary counter for counting pulses from a clock pulse source, and control logic responsive to outputs of the switch control logic and the comparator for supplying reference voltages to the integrator and for controlling the supply of clock pulses to the counter.

In operation, the control logic responds to a clear pulse, as supplied by a central processor, to initialize the system for operation. Upon receipt of a start signal, also from the processor, the switching logic responds to the next output of the zero crossing detector to close the input switch and open the feedback switch of the integrator to permit integration by the integrator of the ensuing half cycle of the AC input voltage. Integration continues until the zero crossing detector senses the conclusion of that half cycle, at which time the switching logic responds to the output of the detector to open the input switch. The integrator therefore develops a DC output voltage of a level and sign determined by the amplitude and sign of a half cycle of the AC input voltage integrated thereby, this integration interval conveniently being termed the data integration interval.

The comparator responds to the output voltage and supplies an output to the control logic identifying the polarity of the integrated voltage. At the conclusion of the integrating cycle, the control logic receives an output from the switching logic, enabling it to respond to the comparator output, both for storing a digital bit identifying the sign of the integrated DC output, and for supplying a reference voltage of opposite sign, and of predetermined amplitude, to the integrator. During the succeeding half cycle of the AC input following the data integration interval, therefore, the storage capacitor of the integrator proceeds to discharge, through the RC integration path, integrating the output voltage of the integrator back to zero voltage. During the interval of the discharge or downward integration, the control logic gates clock pulses of a predetermined repetition rate, or frequency, to a counter which proceeds to accumulate a count equal to the number of clock pulses received thereby. When the integrator output reaches the zero voltage level, (i.e., the output level of the integrator prior to integration), and thus concluding the discharge interval, the comparator supplies a further output to the control logic which responds thereto to terminate further gating of clock pulses to the counter. The count attained by the counter thus comprises the digital data output corresponding to the amplitude of the AC analog input voltage.

Since the DC voltage level of the output of the integrator is proportional to the amplitude of the AC input signal, the time required to discharge or integrate the output voltage of the integrator back to the zero reference level, for a fixed reference potential, is also proportional to the magnitude of the input. Thus, the count accumulated in the counter during the discharge time is proportional to the magnitude of the AC input signal. The repetition frequency of the clock pulse train is selected in accordance with the known frequency of the AC input signal, and the known time constant of the integrator, to afford the desired resolution.

The reference voltages of appropriate sign, or phase, may be provided by absolute DC voltage reference sources of requisite stability consistent with the accuracy required of the conversion, or by a DC reference source which is responsive to changes in the AC signal source. As to the latter, variations in the signal amplitude and frequency of the AC input, typically correspond to variations in the AC supply amplitude and frequency; accordingly, use of a DC reference responsive to these variations serves to eliminate a source of error. In accordance with the invention, such a DC reference source may be provided through use of a further integrator, controlled simultaneously with the integrator of the converter and in response to the same switching logic outputs, to integrate, during the data integration interval, one-half cycle of the AC supply voltage. The resulting DC voltage accordingly is compensated for variations in the AC supply and thus the AC input voltage and is held for the ensuing discharge interval. The thus compensated DC voltage and its inverse then serve as the compensated DC reference voltages for the discharge function.

The system in accordance with the invention affords substantial savings over prior art systems, in view of its substantially reduced complexity and minimum number of components, while affording high accuracy and speed of operation comparable to that of complex prior art converters. For example, the integrator is a basic component of the present system, whereas it is only a small part of prior art converters, as required for effecting the AC to DC conversion. Similarly, the comparator, the switching logic, and the counter, which comprise the remaining major components of the subject system, comprise only a small part of prior art DC–A/D converters. The switches required in the present system are far fewer in number than in prior art systems. Reference voltages as utilized in the present system, of course, are required as well in prior art systems.

Savings in component costs are also realized. For example, the integrating capacitor and resistor of the integrator do not have to have a high absolute accuracy or stability, since they are used to integrate both the signal and the reference. Since the data integration interval and the discharge interval occur in succeeding half cycles of the AC input signal, the integrator needs only to maintain a short time, relative accuracy. This affords absolute conversions with accuracies greater than the tolerances of the components used. This is particularly desirable in the case of the integrating capacitor, since capacitors with tolerances better than 1 percent are difficult to obtain. This facet of the dual data integration-reference integration function of the integrator also will be appreciated to afford a form of self-error compensation, contributing to the high accuracy attained by the system.

DETAILED DESCRIPTION OF THE INVENTION

Figure 2:
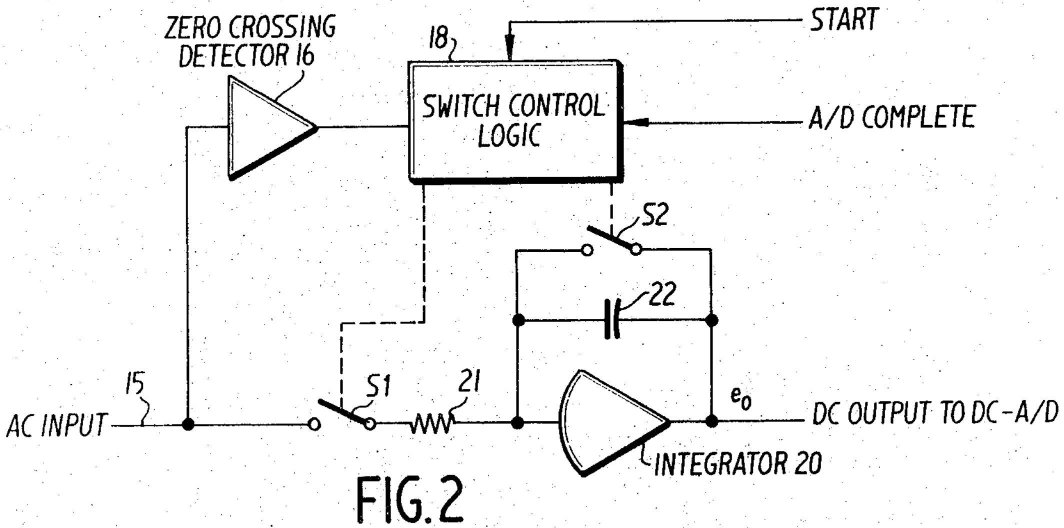
FIG. 2 is a schematic, partly in block diagram form, of an integrator as employed in a prior art AC–A/D converter as in FIG. 1.
Figure 3:
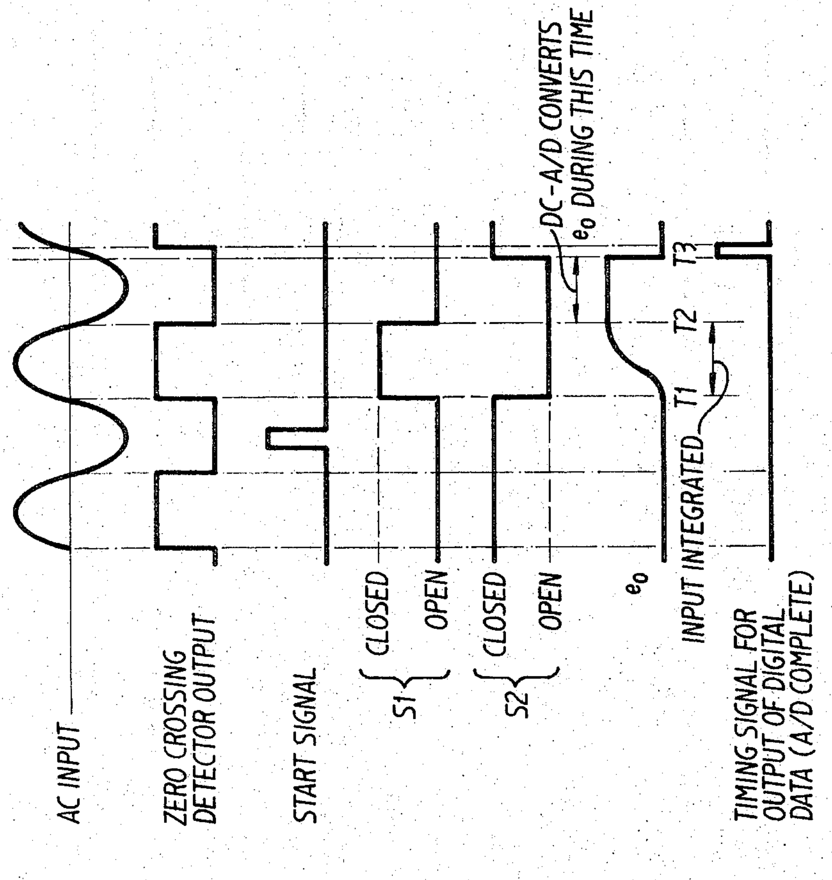
FIG. 3 is a timing chart illustrating the sequence of operations of the integrator of FIG. 2.

As discussed above, the AC–A/D converter of the prior art typically operates to respond to the AC input for developing a DC voltage, that voltage then being supplied to a DC–A/D converter in producing digital output signals representative of the magnitude, or amplitude, of the AC input voltage. A representative such circuit has been shown in block diagram form in FIG. 1 and in more detailed circuit schematic form in FIG. 2; the functioning thereof has been discussed in relation to the timing chart of FIG. 3 which illustrates the sequence of operations of the circuit of FIG. 2, in the foregoing description of the prior art.

In accordance with the invention, AC–A/D conversion is accomplished in essentially a one step operation. The simplified block diagram of FIG. 4 illustrates this one step function, and wherein a unified converter 24 including an integrator 24*a* and a counter 24*b* respond to the AC input voltage for producing directly the digital data output representative of the amplitude of the AC input.

Figure 4:
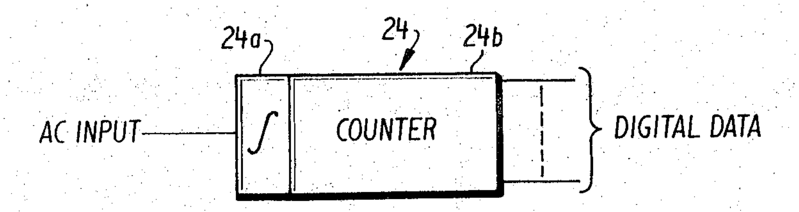
FIG. 4 is a simplified block diagram of an Ac–A/D converter in accordance with the invention.

The implementation of the single step conversion technique of the invention as generally illustrated in FIG. 4 requires the addition to the basic components, i.e., the integrator 24*a* and the counter 24*b*, of only a few additional elements. Specifically, in FIG. 5, wherein the integrator of FIG. 4 is now identified as 24*a'* and the counter of FIG. 4 by 24*b'*, the additional components comprise a comparator 26 and a single pole double throw (SPDT) switch 27 including a first switch position 27*a* for connection to a negative DC reference potential $-V_{DC}$ and a position 27*b* for connection to a positive DC reference potential $+V_{DC}$.

Figure 1:
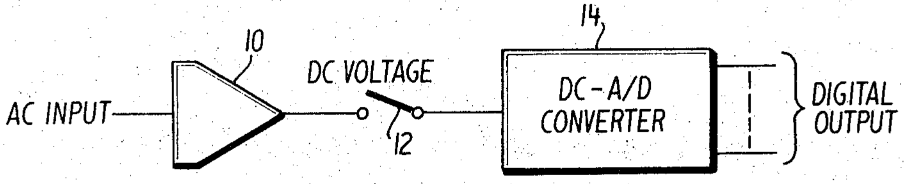
FIG. 1 is a basic block diagram of a prior art AC–A/D converter.
Figure 5:
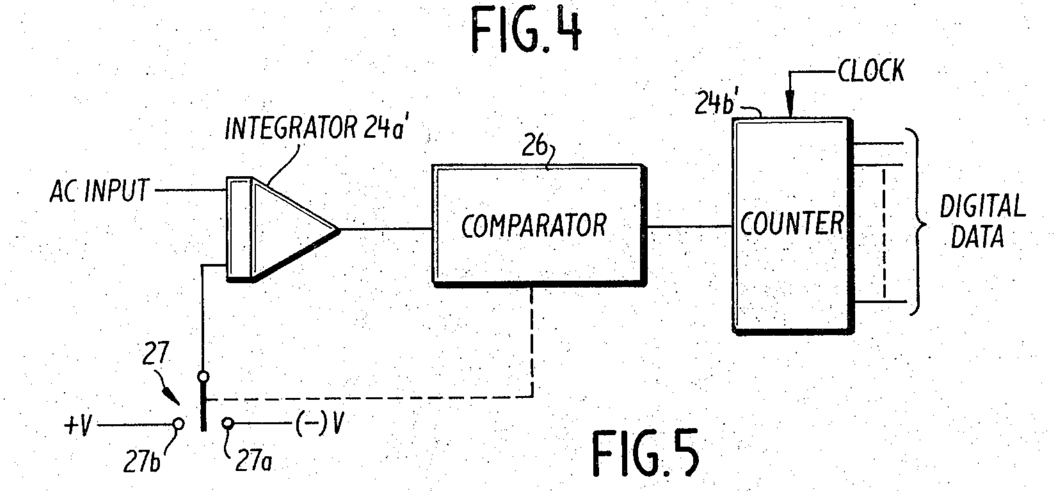
FIG. 5 is a more detailed, functional block diagram of an AC–A/D converter in accorance with the invention.

The simplification of the AC–A/D converter as afforded by the invention relative to the prior art can perhaps best be appreciated in the comparison of the block diagram of FIG. 5 with the prior art converter shown in block diagram in FIG. 1. The integrator 24*a'* of FIG. 5, comprising a major component of the subject converter, is typically but a small portion of the integrator 10 of FIG. 1 utilized in the prior art for converting the AC input to a corresponding DC voltage output. Similarly, the comparator 26 and the counter 24*b'*, comprising the remaining major components of the system of the invention as shown in FIG. 5, have their counterparts in the DC–A/D converter 14 of the prior art system of FIG. 1 but wherein those components are but a small portion of the converter 14.

Furthermore, the comparator 26 of the system of the invention in FIG. 5 responds to, or is driven directly from, a low impedance source, namely the output of the integrator amplifier 24*a'*. By contrast, a comparator as employed in a converter 14 in FIG. 1 of the prior art, typically is driven from a high impedance source such as a ladder network. As a result, the comparator of the system of the invention may be of substantially simplified design relative to the comparator required in prior art converters.

The counter 24*b'* in FIG. 5 similarly in simplified in design implementation since the typical prior art DC–A/D converter requires many additional counter stages to establish timing, beyond those required in the invention. Likewise, the SPDT switch 27 in FIG. 5 represents a substantial reduction in circuit implementation relative to the prior art in that, in the prior art DC–A/D converter, a similar such switch is required for each bit position of the digital output. As an example, if the digital output is to provide a resolution of one part in 2,048, the output must comprise 11 bits. Hence, the prior art converter would require 11 SPDT switches of the type of the single SPDT switch employed in the AC–A/D converter of the invention, as shown at 27 in FIG. 5.

Figures 6, 8, 9:
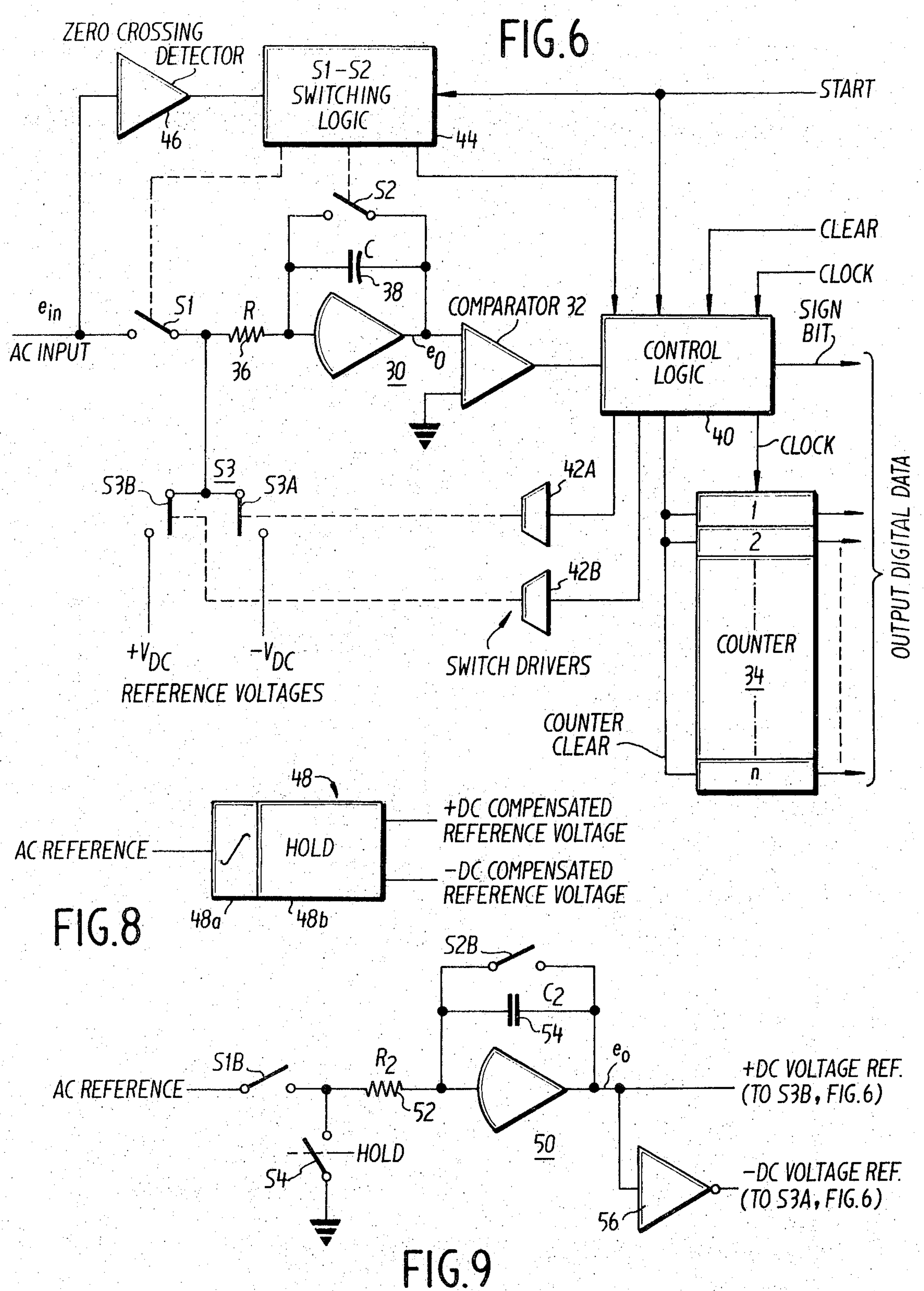
FIG. 6 is a schematic, partly in block diagram form, of the AC–A/D converter of the invention.
FIG. 8 is a simplified block diagram of a system in accordance with the invention for developing compensated DC reference voltages from an input AC reference such as the AC power input to the AC–A/D converter.
FIG. 9 is a circuit schematic of the system of FIG. 8 showing in more detail the operating components utilized in developing the compensated DC reference voltages.

In FIG. 6, the AC–A/D converter of the invention is shown in schematic and partially block diagram form, for converting an AC input signal, $e_{in}$, to a digital data output having a digital value representing the magnitude of the AC input voltage $e_{in}$. The basic components of the system corresponding to those identified in FIG. 5 are shown in FIG. 6 as the integrator 30, the comparator 32, and the counter 34. The SPDT switch is shown in FIG. 6 as switch S3 having position S3A for connection to a negative DC reference potential $-V_{DC}$ and position S3B for connection to a positive DC reference potential $+V_{DC}$. Switch S1 is actuated to connect the AC input signal $e_{in}$ to the input of the integrator through resistor 36, of value R, and which, with feedback capacitor 38, of value C, forms an RC integrating circuit for the integrator 30. Switch S2 shunts capacitor C, and is actuated to an open position both during integration of the AC input, and during discharge of the integrator capacitor C, i.e., integration in a reverse sense to the data integration. SPDT switch S3 is selectively moved to an appropriate one of the positions S3A and S3B for supply of a reference voltage to the integrator, as hereafter discussed. A suitable processor (not shown) may supply start, clear, and clock pulses to control logic 40, the latter selectively gating the clock pulses to the counter 34 in a manner and for a purpose to be described as well as clearing the counter 34 subsequently to each digital data output, in response to the clear pulse. Control logic 40 as well supplies outputs to switch drivers 42A and 42B which operate the corresponding switches S3A and S3B from their normally open to a closed position in a manner to be described.

Prior to initiating conversion, the integrator 30 is initialized to a zero voltage output (or other preselected reference voltage output representing the absence of any integrated voltage value) by closing switch S2 and opening of switches S1 and S3 (i.e., as to switch S3, each of the contact positions S3A and S3B is open as shown in FIG. 6). Binary counter 34 is set to zero in each stage by a counter clear signal from control logic 40, the latter as well inhibiting application of clock pulses to the counter 34. Switching logic 44, which controls opening and closing of switches S1 and S2, is normally disabled from responding to outputs of the zero crossing detector 46.

Figure 7:
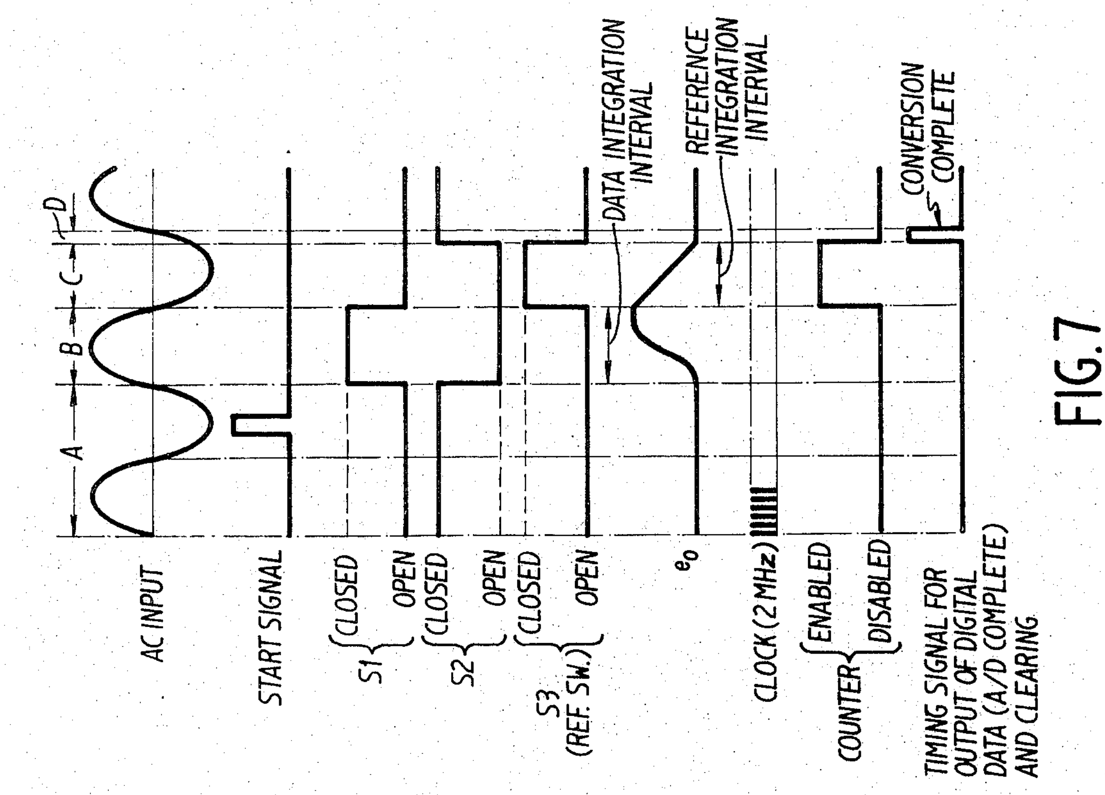
FIG. 7 is a timing chart illustrating the sequence of operations of the AC–A/D converter of the invention as shown in FIG. 6.

The operation of the converter of FIG. 6 will be described with reference to the timing chart of FIG. 7 which illustrates the sequence of operation of various functions performed. To initiate conversion of the AC input signal $e_{in}$, a start signal is issued which enables switching logic 44 and control logic 40. The AC input voltage $e_{in}$ is processed by zero crossing detector 46 such that the first zero crossing of that voltage following the start signal, defining thereby the end of interval A of the voltage $e_{in}$ in FIG. 7, results in an output from the switching logic 44, corresponding to the start of interval B in FIG. 7. Logic 44 closes switch S1 for supply of voltage $e_{in}$ to the integrator 30 and simultaneously opens switch S2 to include the capacitor 38 in the integrator circuit, capacitor 38 and resistor 36 thereby providing the necessary RC time constant for integration of the input voltage $e_{in}$. The output voltage $e_o$ of the integrator increases as the input voltage $e_{in}$ is integrated during the interval B. Note that if integration had begun on the preceding half cycle of interval A (or the succeeding half cycle of interval C), voltage $e_o$ would have increased in a negative direction rather than the positive direction indicated in FIG. 7.

Zero crossing detector 46 then senses the zero crossing defining the end of interval B and provides a second input to switching logic 44 which in response thereto opens switch S1 to remove the input voltage $e_{in}$ from the integrator. During integration of $e_{in}$ in the interval B, comparator 32 detects whether the integrator output voltage $e_o$ is positive or negative and provides an appropriate input to control logic 40 which in turn generates the appropriate sign bit for the output digital data. Typically, a sign bit of "1" corresponds to a positive voltage and a sign bit of "0" corresponds to a negative voltage.

Switching logic 44 as well supplies an output identifying the end of interval B to control logic 40. Control logic 40 responds thereto, and to the polarity indication from comparator 32, to activate the appropriate one of the switch drivers 42*a* and 42*b* to close its corresponding reference switch S3A or S3B at the termination of interval B, and thus with the initiation of interval C of input voltage $e_{in}$. The polarity of the reference voltage selected is opposite that of the integrator output voltage $e_o$ so that during the succeeding interval C, the integrator 30 will integrate back to the initial zero volt level of the output integrated voltage $e_o$. .

The rate of the return or reverse integration is determined by the Rc time constant of the resistor 36 and capacitor 38. As performed in interval C in the specific example, that time constant is selected to be less than the duration of one-half cycle of the input voltage $e_{in}$. Accordingly, the full scale output of the integrated output voltage $e_o$ for a given AC input signal will reduce to zero volts within a time interval, shown as C in FIG. 7, which is less than that of one-half cycle of the AC input voltage of the interval C. This is illustrated in FIG. 7 by the interval D following the conclusion of the reference integration interval C, with the half cycle of the input voltage. The interval D, accordingly, will be of longer duration and the interval C of shorter duration for lower integrator output values $e_o$ .

Switching logic 44 also indicates to control logic 40 the conclusion of the interval B and thus the initiation of the reference integration interval C. At the initiation of interval C, control logic 40 enables application of the clock pulse train to the counter 34. Clocking of the counter continues until comparator 32 senses a zero voltage value of the integrator output $e_o$, and thus the conclusion of the reference integration interval C. Comparator 32 identifies that occurrence to the control logic 40; the control logic 40 responds thereto to disable further clocking of the counter 34. The digital number accumulated in the counter 34 during the reference integration interval therefore is proportional to the magnitude of the AC input voltage $e_{in}$ measured during the preceding data integration interval B, as shown in FIG. 7.

The pulse repetition rate of the clock pulse train, i.e., the clock frequency, is selected in accordance with the desired bit resolution of the system and with respect to the duration of the data and the reference integration intervals. Since maximum sensitivity and response are attained for a data integration interval equal to one-half cycle of the AC input, the clock frequency accordingly is selected to afford the desired bit resolution within the duration of one-half cycle of the AC input. As an example, if 10 bits (one part in 1,024) resolution is required and the input frequency is 400 *Hz*, the integrator must be able to discharge from full scale to zero in less than one-half cycle of the input, or 1.25 milliseconds. Also, during the 1.25 milliseconds, the counter must be able to count to 1,024. Thus, a 10 stage count is required and at least a 1 MHz clock (1,000 pulses in each millisecond) is required. Under the same conditions but wherein 11 bits resolution is desired, (one part in 2,048) an 11 stage counter is required and a 2 MHz clock (2,000 pulses in 1 millisecond) is required at a minimum.

Returning to FIG. 7, at the start of interval D, the reference voltage is removed from the input to the integrator by opening of the previously closed one of the switches S3A and S3B, and switch S2 is closed to initialize the integrator 30 in preparation for the next cycle of A/D conversion.

The reference voltages of positive and negative polarity can be absolute DC reference values, or DC reference values which vary in accordance with changes in the AC signal source, thus providing compensation for AC supply variations. A circuit to implement the compensated DC reference is now considered.

In FIG. 8 is shown a simplified block diagram of a technique of obtaining a compensated DC reference voltage for the AC analog to digital converter. Specifically, an integrator-held circuit 48 including an integrator component 48*a* and a hold component 48*b* receives the AC reference input voltage and generates opposite polarity, DC compensated reference voltages.

By utilizing the integrator, the DC reference values are compensated for frequency variations, amplitude variations, and noise in the AC reference voltage. When utilized in the A/D converter of the invention, as shown in FIG. 6, the compensated DC reference voltage generator can be implemented quite readily, through the use of an additional integrator, an inverter, and by modifying switches S1 and S2 of FIG. 6 to be double pole, single throw (DPST) switches.

As shown in FIG. 9, therefore, the compensated DC reference circuit includes integrator 50 having an input resistor 52 of value R2, a capacitor 54 of value C2, inverter 56, and switches S1B and $S2_b$, respectively representing second poles of switches S1 and S2B, respectively representing second poles switches S1 and S2 of FIG. 6. A further switch S4 is provided to perform a hold function as now to be described.

Figures 10, 11:
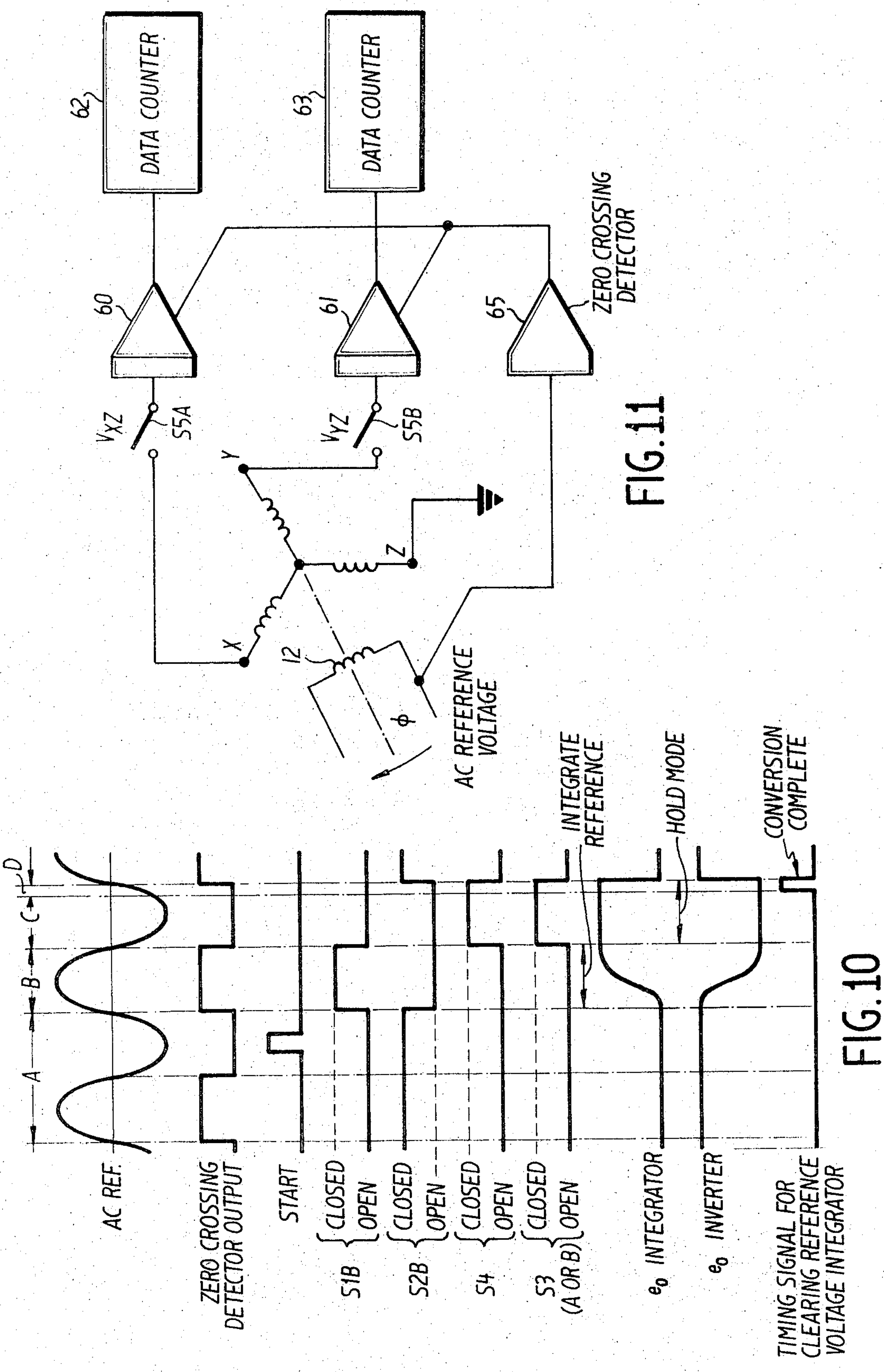
FIG. 10 is a timing chart illustrating the sequence of operations of the circuit of FIG. 9.
FIG. 11 is a schematic, partly in block diagram form, of a three-wire synchro system utilizing AC–A/D converters in accordance with the invention in accordance with a synchro to digital application of the invention.

In operation, and with reference to the timing chart of FIG. 10, the AC reference corresponds to the AC source voltage, fluctuations in which produce fluctuations in the AC input to be integrated. The zero crossing detector output and the start pulse are identical to the corresponding waveforms in FIG. 7. At the zero crossing following the start pulse, and, therefore at the initiation of interval B switch S2B is opened and S1B is closed, identically as in FIG. 7, whereupon the Ac reference input is applied to integrator 50 and integrated thereby producing the integrated output $e_o$ shown in FIG. 10. Thus, the AC reference is integrated at the same time that the AC input is integrated. At the next zero crossing, and thus between intervals B and C, switch S1B is opened and switch S4 is closed whereby the integrator 50 is set to a "HOLD" condition. The positive compensated DC reference voltage then is produced at the output of integrator 50 and the negative thereof is produced at the output of inverter 56. As discussed in relation to FIG. 6, the appropriate one of these reference voltage outputs then is selected for the reference integration interval.

The output of the integrator is equal to $$E_{O_{Ref}}=\frac{1}{R_2C_2}\int_0^t E_R \sin wt\,dt=\frac{1}{R_2C_2}\int_0^t E_R \sin 2\pi f dt$$

Since the integrator is integrating over one-half a cycle, then $E_0$ equals $$E_{O_{Ref}}=\frac{1}{R_2C_2}\int_0^{2/f} E_R \sin 2\pi f dt=\frac{E_R}{2\pi f R_2C_2}\,[\cos 2\pi f t]_0^{2/f}$$

$$E_{O_{Ref}}=(E_R/2\,\pi f R_2C_2)\,(2)=E_R/\pi f R_2C_2$$

$$E_{O_{Ref}}=E_R/\pi f R_2C_2$$

Thus the output of the integrator is a function of the amplitude and frequency of the reference and of the time constant, $R_2C_2$. The accuracy is only affected by the tolerance of $R_2$ and $C_2$ and since ±0.005 percent resistor and 0.1 percent capacitors are presently available, then an 0.2 percent accuracy can be obtained by using this method. This is a great improvement since in most systems the AC sources only have a ±20 percent overall frequency amplitude regulation — which directly and adversely affects the accuracy of the conversion.

In FIG. 11, there is shown partly in block diagram form and partly in schematic form, an application of the invention for converting three wire synchro AC inputs to digital number outputs. The voltage presented to the integrator is proportional to the position A of the rotor 12, which, in turn, corresponds to some angle ($\sigma$). Winding Z is grounded, winding X supplies voltage $V_{XZ}$ and winding Y supplies voltage $V_{YZ}$. Switches S5A and S5B of FIG. 11 correspond to switch S1 of FIG. 1 and are to be understood to operate under control of switching logic similar to logic 44 in FIG. 6, for operation of switch S1. Integrators 60 and 61 correspond to integrator 30 and are understood to contain the necessary resistor, capacitor and switching components to accomplish the input or data integration, and the reverse integration of the reference voltage. The outputs of integrators 60 and 61 are made input to data counters 62 and 63, each of which comprises necessary control logic, clock generation and binary counter components as hereinbefore. The outputs of each of the counters 62 and 63 comprises digital data including a sign bit.

Distinctive in the three-wire synchro application is the use of the AC reference voltage for controlling the zero crossing detector 65. Both A/D converters are controlled simultaneously by the output of detector 65. Further, the input to detector 65 is the AC reference voltage which typically exhibits constant amplitude, affording maximum accuracy in sensing zero crossing. The feature of employing the AC reference voltage for zero crossing detector is distinguished over the general application of FIG. 1 where the unknown AC input must provide the input for sensing of zero crossings.

Thus, both of the AC analog inputs $V_{XY}$ and $V_{YZ}$ are sampled and integrated simultaneously, under control of a common zero crossing detector, and the conversions to digital value outputs are completed substantially simultaneously. The digital data produced by the counter outputs in each instance then represents the amplitude of the respective AC synchro voltages. That digital data then is transferred to a location for utilization. Typically, the data is transferred to a digital processor where the digitized voltages are then translated by the processor into numerical representation of the synchro angle, or the sine or the cosine of the angle. Alternately, a set of data holding registers can be added to the converter so that when a conversion is complete, the digital data is transferred automatically to the holding registers where it remains continuously for use, until updated. By this technique, the converter, once for each cycle, can convert the input signal and update the data in the holding registers.

As above noted, integration of one-half cycle, (or a portion of one-half cycle), of each complete AC input cycle affords near maximum useful speed of conversion, since meaningful changes in input data are difficult to detect more rapidly. In addition, in portions of the waveform near the zero crossing, very little information is available since the voltage is very small. Also, errors due to noise and distortion proportionally increase where less than a substantial portion of an input half cycle is integrated. Hence, selection of a full half cycle for the data integration interval appears optimum and thus desirable, although intervals of other durations may be selected as well.

If desired, by using a parallel arrangement of substantially identical circuits as shown in FIG. 6, each half cycle of an input signal could be integrated to provide the maximum useful input data rate.

In addition to the advantages of the system of the invention relative to the prior art as discussed above, it is also significant to note that the technique of the invention provides self-error compensation. Inaccuracies in tolerances, such as of components related to the integration (e.g., the resistor and integrating capacitor of the integrator) equally affect the data and the reference integration operations and thus self-compensation is afforded in deriving the final digital output value. Note also that the integrating capacitor and resistor associated with the integrator are not required to have high absolute accuracy or long-term stability. Specifically, these elements are employed for integration over time durations of at most one-half cycle of the input AC signal and are commonly employed for both the data integration interval and the reference integration interval; accordingly, they need only maintain a short time stability to afford highly accurate results. Absolute conversions with accuracies greater than the tolerances of the components used thereby is realized. It also follows that where absolute values are not required but rather ratios of two values, as in the three-wire synchro application of the converters of the invention, in deriving angular positions, that even higher accuracies are realized.

Numerous modifications and adaptations of the system of the invention will be apparent to those skilled in the art and thus it is intended by the appended claims to cover all such modifications and adaptations which fall within the true spirit and scope of the invention.

What is claimed is:

1. An AC analog to digital converter for converting input data comprising an AC analog voltage to a digital number proportional to the amplitude of the AC analog voltage, comprising:

zero crossing detector means producing an output in response to each zero crossing of the AC analog voltage, integrating means, input switching means and clearing switching means associated with said integrator, switching logic means receiving the outputs of said detector means and responsive to a first zero crossing detector output to produce an output for closing said input switching means for supply of the AC analog voltage to said integrating means and to a next successive detector output to produce an output for opening said input switching means, defining there between a data integrating interval, comparator means responsive to the integrated output voltage of said integrating means to indicate the sign and amplitude of the integrated output voltage of the integrating means, control logic responsive to the output of said switching logic means produced in response to the said next successive detector output concluding the data integration interval, to initiate a reference integration interval, said control logic responding to the sign indication of said comparator means for supply of a DC reference voltage to said integrating means of predetermined amplitude and of opposite polarity to the sign indication, a counter, said control logic gating clock pulses of a predetermined repetition rate to said counter during the reference integration interval and responding to the zero voltage indication output of said comparator for concluding the reference integration interval and terminating the gating of further clock pulses to said counter and the supply of the DC reference voltage to said integrating means, the count attained by said counting means during the reference integration interval comprising a digital number proportional to the amplitude of the AC analog voltage for the half-cyle thereof integrated during the data integration interval, and wherein said reference voltages comprise DC compensated reference voltages of equal amplitude and opposite polarity produced from an AC reference voltage by a compensating circuit comprising:

further integrating means, further input switching means operated by said switching logic to be closed for the duration of the data integration interval for supply of the AC reference voltage to said further integrating means, and to be open for the reference voltage integrating interval, and holding switch means connected between the input of said further integrating means and ground and normally in an open position and closed by said logic switching means to maintain the DC integrated voltage output of said further integrating means for the reference integration interval of said integrating means of said converter, thereby to provide a DC reference voltage output compensated for variations in the AC reference supply voltage, and an inverter receiving the output of said further integrating means for supplying the compensated DC reference voltage of the opposite polarity.

2. A synchro to digital converter for use with a synchro having a rotor winding and X, Y and Z stator windings, said rotor winding being energized by an AC reference voltage and said stator windings producing X–Y and Y–Z AC analog outputs proportional to the angular position of the rotor, comprising first and second integrating means, first and second input switching means and first and second clearing switching means associated with said first and second integrating means, respectively, a zero crossing detector responsive to the AC reference voltage and producing an output in response to each zero crossing thereof, switching logic means receiving the outputs of said zero crossing detector and responsive to a first zero crossing detector output thereof to close said first and second input switching means for supply of the X–Y and Y–Z AC analog voltages to said first and second integrating means, respectively, and responsive to a next successive zero crossing detector output to open said first and second input switching means, defining thereby between the closing and opening of each said input switching means a data integrating intervals for each said integrating means, each said integrating means producing as an output a DC voltage proportional to the magnitude of the respective AC input analog voltage, comparator means responsive to the integrated output voltage of said integrating means to indicate the sign and amplitude of the integrated output voltage of each said integrating means, control logic responsive to the output of said switching logic means corresponding to the said next successive detector output concluding the data integration interval, to initiate a reference integration interval, said control logic responding to the sign indication of said comparator means for supply of a DC reference voltage to each said integrating means of predetermined amplitude and of opposite polarity to the sign indication of the integrated output voltage of the respective integrating means produced thereby in the preceding data integration interval, for integration by said respective integrating means to reduce the respective DC integrated voltage outputs thereof to zero value, the respective intervals of reference voltage integration of said first and second integrating means varying in duration as a function of the respective values of the DC integrated output voltages thereof, first and second counters respectively associated with said first and second integrating means, and said control logic gating clock pulses of a predetermined repetition rate to each said first and second counters during the respective reference integration intervals thereof and said control logic responding to the zero voltage indication output of said comparator for the respective integrating means to conclude the respective reference integration intervals of the first and second integrating means, to terminate the gating of further clock pulses to the corresponding counters and the supply of the respective DC reference voltages to said corresponding integrating means, each counter producing at the conclusion of the reference integration interval a count output comprising a digital number proportional to the amplitude of the corresponding one of the X–Y and Y–Z analog output voltages for the half-cycle thereof integrated during the preceding data integration interval, said switching logic means closing said first and second clearing switching means at the conclusion of the reference integration interval of the respective first and second integrating means, respectively, to clear the respective integrating means and opening said clearing switching means at the initiation of a successive data integration interval, and wherein, said reference voltages comprise DC compensated reference voltages of equal amplitude and opposite polarity, produced by a compensating circuit in response to the AC reference voltage supplied to the rotor winding of the synchro, comprising:

further integrating means, further means operable for the duration of the data integration interval for supply of the AC reference voltage to said further integrating means, and holding means for maintaining the DC integrated voltage output of said further integrating means, developed during the data integration interval, for the duration of the succeeding reference integration interval of said integrating means of said converter, thereby to provide a DC voltage reference output compensated for variations in the AC reference supply voltage, and an inverter receiving the output of said further integrating means for supplying the DC compensated reference voltage of the opposite polarity.

* * * * *